United States Patent
Li et al.

(10) Patent No.: US 8,050,072 B2
(45) Date of Patent: Nov. 1, 2011

(54) DUAL STAGE SENSING FOR NON-VOLATILE MEMORY

(75) Inventors: Hai Li, Eden Prairie, MN (US); Yiran Chen, Eden Prairie, MN (US); Yuan Yan, Edina, MN (US); Brian Lee, Boston, MA (US); Ran Wang, Irvine, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 207 days.

(21) Appl. No.: 12/490,493

(22) Filed: Jun. 24, 2009

(65) Prior Publication Data

US 2010/0085797 A1 Apr. 8, 2010

Related U.S. Application Data (60) Provisional application No. 61/103,748, filed on Oct. 8, 2008.

(51) Int. Cl.
*G11C 5/06* (2006.01)

(52) U.S. Cl. ........... 365/63; 365/206; 365/207; 365/163

(58) Field of Classification Search ............... 365/63, 365/207, 206, 163
See application file for complete search history.

(56) References Cited

U.S. PATENT DOCUMENTS

| | | | |
|---|---|---|---|
| 4,807,195 A | 2/1989 | Busch et al. | |
| 7,082,076 B2 * | 7/2006 | Terzioglu et al. | 365/230.06 |
| 7,184,290 B1 | 2/2007 | Lee et al. | |
| 7,433,250 B2 | 10/2008 | Jung | |
| 7,436,699 B2 | 10/2008 | Tanizaki et al. | |
| 2002/0071302 A1 * | 6/2002 | Kawasumi | 365/63 |
| 2008/0130390 A1 * | 6/2008 | Nakai et al. | 365/205 |

* cited by examiner

*Primary Examiner* — Son Dinh
*Assistant Examiner* — Nam Nguyen
(74) *Attorney, Agent, or Firm* — Fellers, Snider, et al.

(57) ABSTRACT

A method and apparatus for accessing a non-volatile memory cell. In some embodiments, a memory block provides a plurality of memory cells arranged into rows and columns. A read circuit is configured to read a selected row of the memory block by concurrently applying a control voltage to each memory cell along the selected row and, for each column, using a respective local sense amplifier and a column sense amplifier to successively differentiate a voltage across the associated memory cell in said column to output a programmed content of the row.

20 Claims, 7 Drawing Sheets

DUAL STAGE SENSING FOR NON-VOLATILE MEMORY

RELATED APPLICATIONS

This application makes a claim of domestic priority under 35 U.S.C. §119(e) to U.S. Provisional Patent Application No. 61/103,748 filed Oct. 8, 2008.

BACKGROUND

Data storage devices generally operate to store and retrieve data in a fast and efficient manner. Some storage devices utilize a semiconductor array of solid-state memory cells to store individual bits of data. Such memory cells can be volatile (e.g., DRAM, SRAM) or non-volatile (RRAM, STRAM, flash, etc.).

As will be appreciated, volatile memory cells generally retain data stored in memory only so long as operational power continues to be supplied to the device, while non-volatile memory cells generally retain data storage in memory even in the absence of the application of operational power.

In these and other types of data storage devices, it is often desirable to increase efficiency and reliability, particularly by improving sensing, data throughput, and bandwidth of an array of memory cells.

SUMMARY

Various embodiments of the present invention are directed to a method and apparatus for accessing a non-volatile memory cell.

In some embodiments, a memory block provides a plurality of memory cells arranged into rows and columns. A read circuit is configured to read a selected row of the memory block by concurrently applying a control voltage to each memory cell along the selected row and, for each column, using a respective local sense amplifier and a column sense amplifier to successively differentiate a voltage across the associated memory cell in said column to output a programmed content of the row.

In other embodiments, a memory block having a plurality of memory cells arranged into rows and columns is provided. A selected row of the memory block is read with a read circuit configured by concurrently applying a control voltage to each memory cell along the selected row and, for each column, using a respective local sense amplifier and a column sense amplifier to successively differentiate a voltage across the associated memory cell in said column to output a programmed content of the row.

These and various other features and advantages which characterize the various embodiments of the present invention can be understood in view of the following detailed discussion and the accompanying drawings.

DETAILED DESCRIPTION

Figure 1:
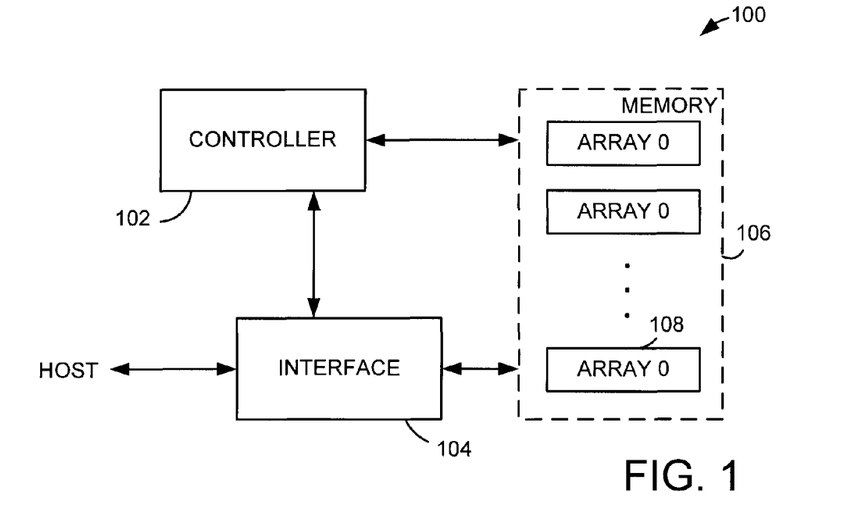
FIG. 1 is a generalized functional representation of an exemplary data storage device constructed and operated in accordance with various embodiments of the present invention.

FIG. 1 provides a functional block representation of a data storage device 100 constructed and operated in accordance with various embodiments of the present invention. Top level control of the device 100 is carried out by a suitable controller 102, which may be a programmable or hardware based microcontroller. The controller 102 communicates with a host device via a controller interface (I/F) circuit 104. A memory space is shown at 106 to comprise a number of memory arrays 108 (denoted Array 0-N), although it will be appreciated that a single array can be utilized as desired. Each array 108 comprises a block of semiconductor memory of selected storage capacity. Communications between the controller 102 and the memory space 106 are coordinated via the I/F 104.

Figure 2:
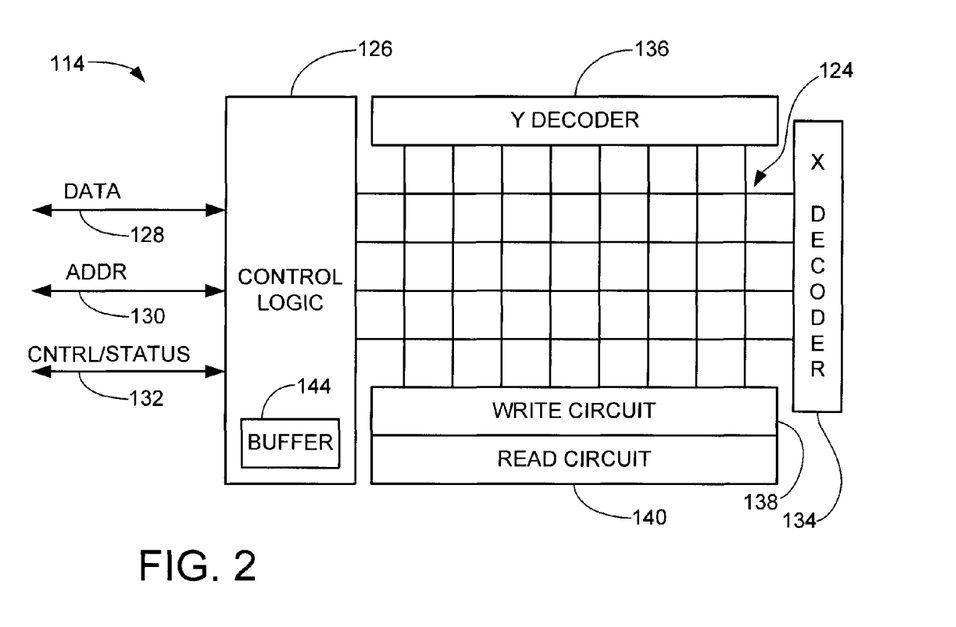
FIG. 2 shows circuitry used to read data from and write data to a memory array of the device of FIG. 1.

FIG. 2 provides a generalized representation of selected aspects of the memory space 114 of FIG. 1. Data can be stored as an arrangement of rows and columns of memory cells 124, accessible by various row (word) and column (bit) lines, etc. The actual configurations of the cells and the access lines thereto will depend on the requirements of a given application. Generally, however, it will be appreciated that the various control lines will generally include enable lines that selectively enable and disable the respective writing and reading of the value(s) of the individual cells.

Control logic 126 receives and transfers data, addressing information and control/status values along multi-line bus paths 128, 130 and 132, respectively. X and Y decoding circuitry 134, 136 provide appropriate switching and other functions to access the appropriate cells 124. A write circuit 138 represents circuitry elements that operate to carry out write operations to write data to the cells 124, and a read circuit 140 correspondingly operates to obtain readback data from the cells 124. Local buffering of transferred data and other values can be provided via one or more local registers 144. At this point it will be appreciated that the circuitry of FIG. 2 is merely exemplary in nature, and any number of alternative configurations can readily be employed as desired depending on the requirements of a given application.

Figure 3:
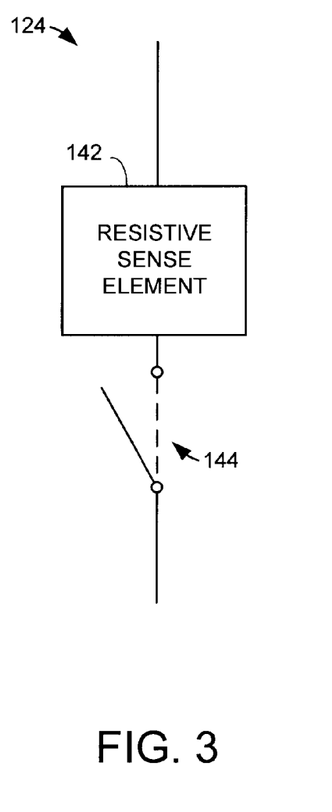
FIG. 3 displays an exemplary memory cell capable of being used in the memory array of FIG. 2.

FIG. 3 displays functional block representations of a memory cell, such as the memory cell 124 of FIG. 2, constructed and operated in accordance with various embodiments of the present invention. The memory cell 124 has a resistive sense element (RSE) 142 connected in series with a switching device 144. The switching device 144 functions to increase the resistance of the unit cell 110 when in an open position, as shown, that effectively prevents current from passing. In contrast, a closed position allows the switching device 144 to receive current and pass it through the unit cell 124. A closed switching device 144 also allows current to pass through the RSE 142 in multiple directions.

In some embodiments, the RSE 142 of each memory cell 124 has magnetic random access memory (MRAM) configuration, such as a spin-torque transfer random access memory (STTRAM or STRAM) configuration. Such a configuration can allow a predetermined write current to be spin polarized and program a free layer of the RSE 142 to a selected magnetic orientation that results in either a high or low resistive state based on the magnetic relationship with a fixed layer of the RSE 142. Alternatively, the RSE 142 can consist of resistive random access memory (RRAM) to which a current bias forms a conductive filament through a barrier layer between electrodes.

In yet another embodiment, a programmable metallization cell (PMC) can be utilized in one, or many, RSE 142. As such, a current bias in the RSE 142 can induce ions to penetrate, or dissipate from, a barrier layer and form a conductive filament between electrodes.

Advantages of these RSE cells over other types of nonvolatile memory cells such as EEPROM and flash include the fact that no floating gate is provided in the cell construction. Additionally, no erase operation is necessary prior to the writing of new data to an existing set of cells. Rather, RSE cells can be individually accessed and written to any desired logical state (e.g., a "0" or "1") irrespective of the existing state of the RSE cell. Also, write and read power consumption requirements are substantially reduced, significantly faster write and read times can be achieved, and substantially no wear degradation is observed as compared to erasable cells, which have a limited write/erase cycle life.

However, a construction of a memory cell 124 with an RSE 142 and a switching device 144 connected in series can have disadvantages, such as having a low sensing margin. For example, the difference between a programmed low resistive state and a programmed high resistive state for the RSE 142 can be relatively small and correspond to difficulty in precisely determining the logical state of the memory cell 124. Furthermore, an additional disadvantage to a low sensing margin can be the amount of data that can be outputted, in part due to the time spent discerning between the resistive states of a number of RSE 142.

Accordingly, an increase in sensing margin can greatly increase the reliability and data throughput for a memory device. In various embodiments of the present invention, each memory cell is connected in series with a local sense amplifier and a column sense amplifier to efficiently differentiate the logical state of a memory cell. As a result, a large number of logical states corresponding to a plurality of memory cells along a row can be outputted simultaneously. Hence, precise memory cell sensing is combined with a high volume of data throughput.

Figure 4:
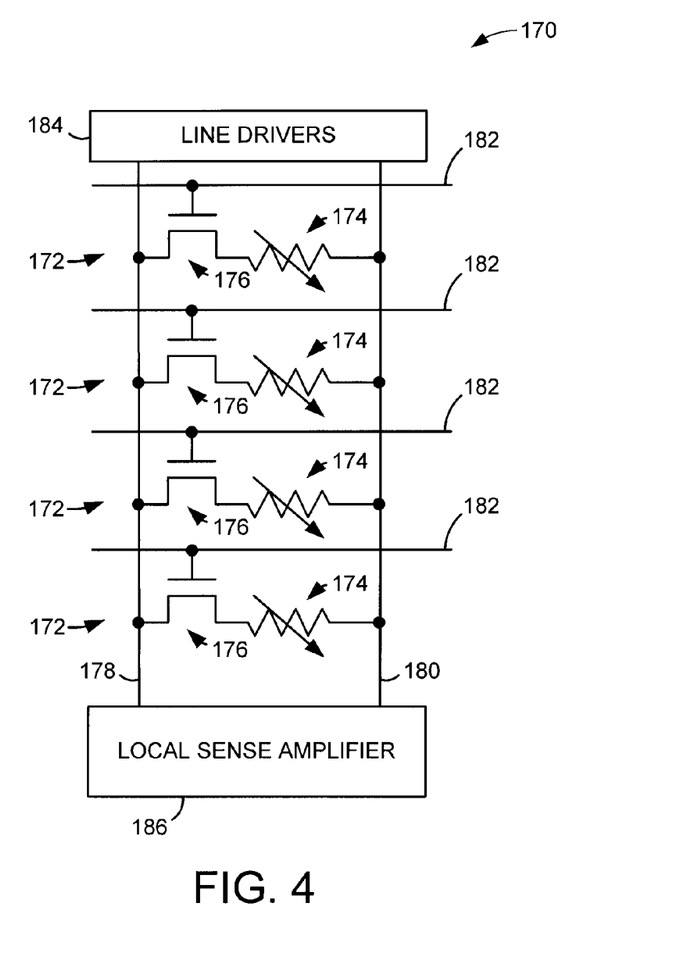
FIG. 4 displays an exemplary column of memory cells constructed and operated in accordance with various embodiments of the present invention.

In FIG. 4, an exemplary column of memory cells 170 is shown as constructed in accordance with various embodiments of the present invention. A plurality of memory cells 172, such as the exemplary memory cell 124 of FIGS. 2 and 3, providing a RSE 174 and a switching device 176 are connected to section control lines 178 and 180. Likewise, the switching device 176 of each memory cell 172 is connected and controlled by a row control line 182. As such, the row control line 182 can be configured to provide a signal to activate the switching device 176 and allow current to flow from one section control line 178 to the other line 180.

In some embodiments, a line driver 184 either alone or in combination can configure the section control lines 178 and 180 to direct current through a selected one, or many, memory cells 172 at a time. As a current flows through a selected memory cell 172, a resulting voltage will indicate the resistive state of the RSE 174. Such resistive state is sensed by a local sense amplifier 186 that is connected to the section control lines 178 and 180. A sensed voltage corresponding to the sensed resistive state of the selected memory cell 172 can then be differentiated in various manners including, but not limited to, application of a gain to amplify the resistive voltage.

Thus, the column configuration of FIG. 4 can provide advantageous sensing of the resistive state of a memory cell 172 by differentiating a sensed voltage through the local sense amplifier 186. Such a configuration also allows more noise toleration due to the presence of the local sense amplifier 186 in connection with a small number of memory cells 172.

However, it should be noted that the number and orientation of the memory cells 172 are not limited and can be configured in various manners to provide advantageous sensing. Similarly, the presence of line drivers is not restricted. That is, a global set of line drivers can provide control of the column 170 as easily as a set of line drivers 184 connected to each column of an array of columns of memory.

Figure 5:
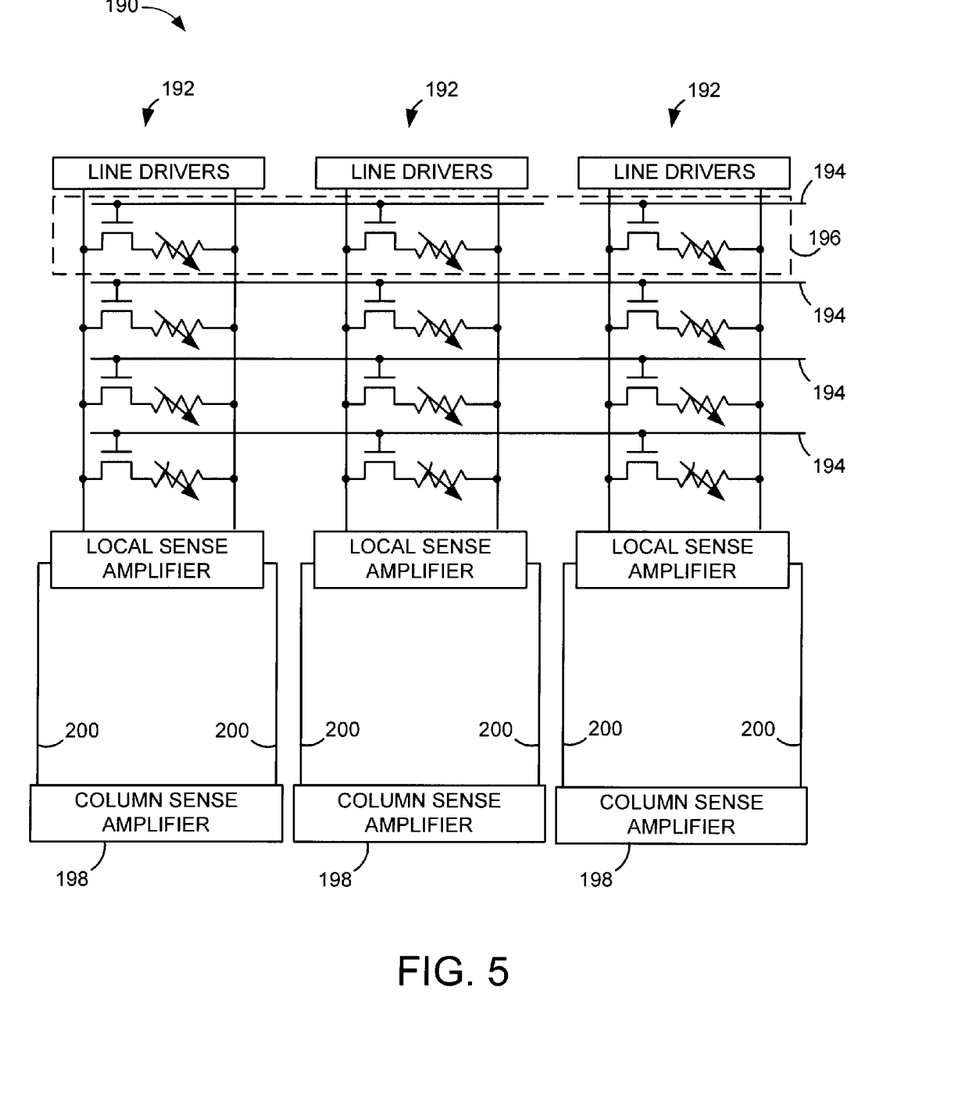
FIG. 5 illustrates an exemplary block of memory cells constructed and operated in accordance with various embodiments of the present invention.

An example of such an block of columns of memory is illustrated in FIG. 5. As shown, a plurality of columns of memory cells 192 are connected via row control lines 194 that define a row of memory cells 196. In addition, the local sense amplifier of each column of memory 192 is connected to a column sense amplifier 198 by global control lines 200. Consequently, any sensed voltage that is differentiated by a local sense amplifier is further differentiated by the column sense amplifier 198 to result in an efficient and precise determination of the logical state of a selected memory cell in the column 192.

As can be appreciated, a multitude of differentiated logical states can be outputted simultaneously through the utilization of a column sense amplifier 198 for each column of memory 192. As such, the resistive state of all the memory cells along the row of memory 196 can each be differentiated by a local sense amplifier and column sense amplifier to result in concurrent production of all the logical states of the row of memory 196.

It should be noted, however, that in some embodiments the global control lines 200 are configured to be more conductive than the section control lines. Such increased conduction can allow an increased current to pass to the respective column sense amplifier 198 in an efficient manner without degrading. Also, as noted above the displayed number of line drivers is not limiting and can be configured as needed to provide efficient control of the respective columns of memory 192.

Figure 6:
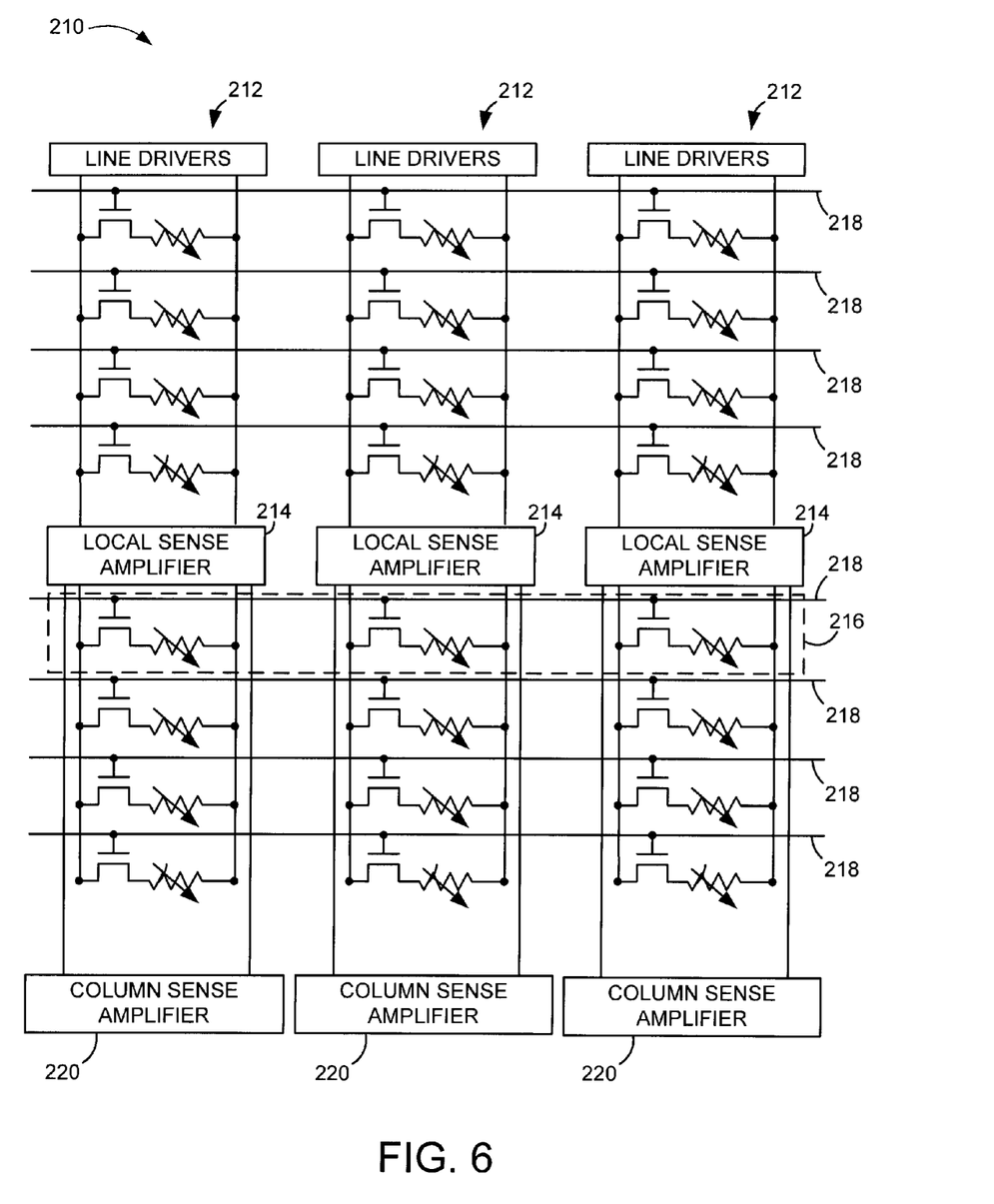
FIG. 6 provides an exemplary block of memory cells constructed and operated in accordance with various embodiments of the present invention.

An alternative exemplary block of columns of memory 210 is displayed in FIG. 6 in accordance with the various embodiments of the present invention. In contrast to the array of columns of memory 190 of FIG. 5, each local sense amplifier 214 of each column 212 is connected to a greater number of memory cells. While the number of memory cells connected to a local sense amplifier 214 is not limited, a reduction of noise toleration by the local sense amplifier 214 is possible when an increased number of memory cells are connected.

Meanwhile, the block of columns of memory 210 and 190 of FIG. 5 are similar in the fact that the various rows of memory cells 216 and 196 correspond to a row control line 218 and 194 that is capable of activating all the memory cells of the row. Regardless of the configuration of the memory cells in relation to the local sense amplifier 214, a column sense amplifier 220 is connected to each column 212 to allow dual differentiation of sensed voltage from the memory cells.

Figure 7:
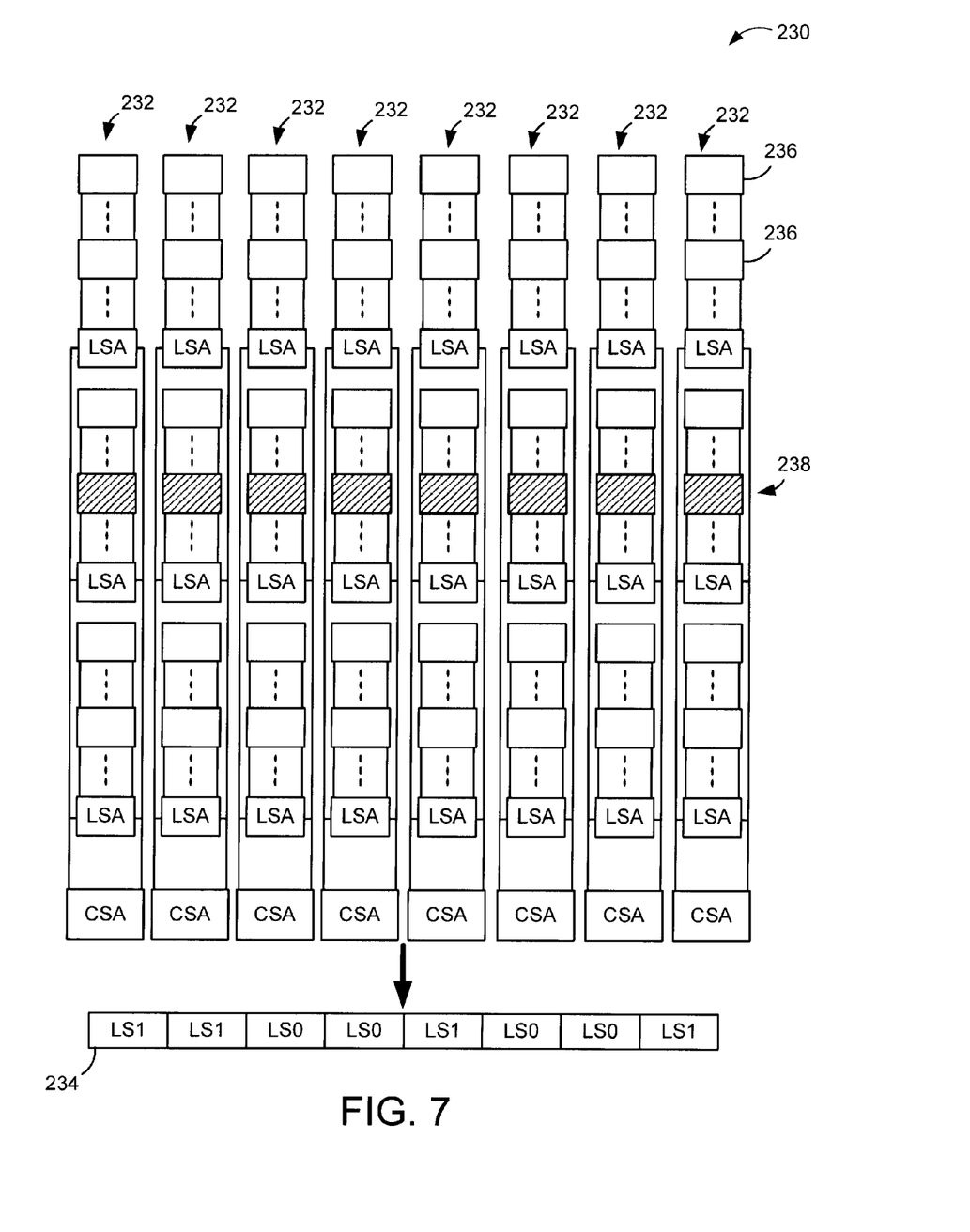
FIG. 7 illustrates an exemplary block of memory cells constructed and operated in accordance with various embodiments of the present invention.

In FIG. 7, an exemplary block of memory cells 230 is shown as constructed and operated in accordance with various embodiments of the present invention. A plurality of columns of memory 232 are each connected in series with a column sense amplifier that is capable of simultaneously outputting the programmed state of numerous memory cells along a row of memory. In some embodiments, the outputted programmed states are kept in an output region 234 that can be a variety of components including, but not limited to, a latch and multiplexer.

It should be noted that each column of memory shown in FIG. 7 has a plurality of individual sectors that are defined by a local sense amplifier (LSA) connected to a plurality of memory cells 236. Furthermore, each local sense amplifier is connected to a corresponding column sense amplifier (CSA).

In operation according to various embodiments, a row of memory 238 is activated to allow either a read or write current to pass through selected memory cells. As a current passes through each selected memory cell, a sensed resistive state will be differentiated by the corresponding local sense amplifier and column sense amplifier to precisely determine the logical state of the selected memory cell. With a plurality of columns of memory 232 and respective sense amplifiers, all the memory cells of the row of memory 238 can be sensed, differentiated, and outputted simultaneously. Thus, a burst mode can be facilitated by the block of memory cells 230 by outputting a number of sensed logical states concurrently.

While each column has the capacity to differentiate multiple memory cells along a column concurrently, in various embodiments, a single memory cell from each row is differentiated. Such a configuration provides advantageous speed in differentiation with the combined ability to output vast amounts of logical states along a row. However, the array of memory 230 can be configured in a variety of manners to allow multiple memory cells to be accessed and differentiated concurrently along a column.

Figure 8:
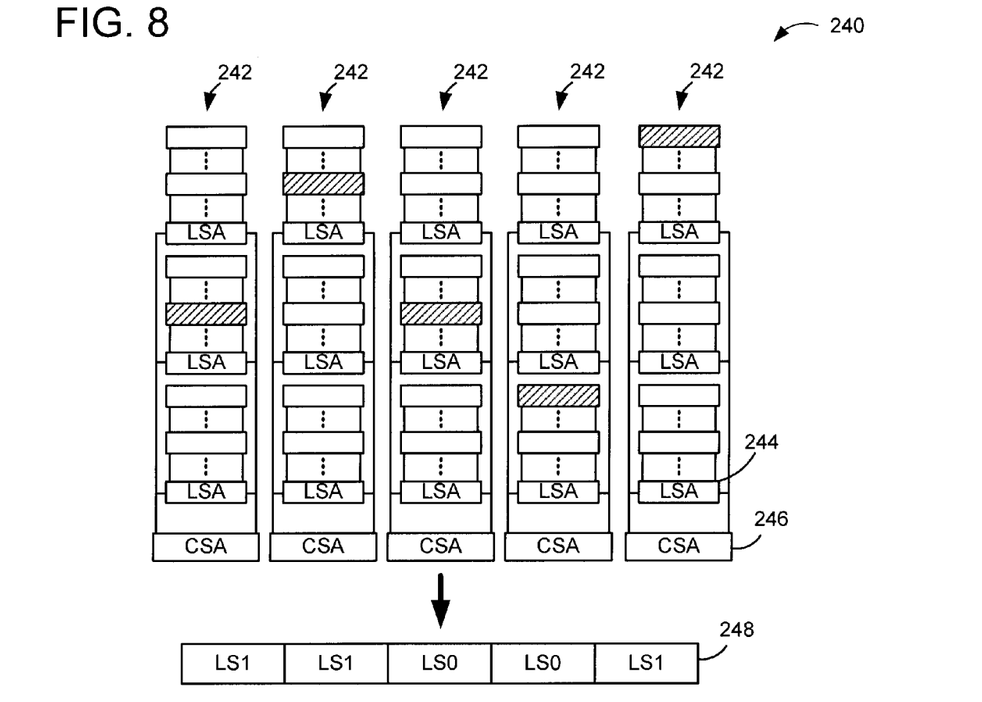
FIG. 8 shows an exemplary block of memory cells constructed and operated in accordance with various embodiments of the present invention.

FIG. 8 displays another exemplary block of memory cells 240. A plurality of memory cells are connected in series to a local sense amplifier 244 and a column sense amplifier 246. However, the array 240 is shown providing sensed logical states from non-adjacent columns of memory 242 to an output region 248. That is, memory cells positioned in different rows are being sensed and the respective logical states are being simultaneously outputted regardless of the location of the memory call in the column 242.

For clarification, the array of memory cells 240 can output multiple logical states from a number of different columns and rows of memory. As such, the array 240 is not limited to sensing memory cells located along the same row of memory. Similarly, the array 240 can be configured so that the logical address of the memory cells is dissimilar from their respective physical address. That is, the row or column of memory that a memory cell is oriented does not mandate a corresponding physical location on a memory device. For example, a number of memory cells could be positioned physically adjacent to one another on a memory device but be oriented in dissimilar columns and rows of memory so that access to one memory cell does not correspond to access to the physically adjacent cells.

It should further be noted that the row and column orientations of the memory cells shown in FIGS. 5-8 are not limited and can be interchanged as necessary. For example, a row of memory is not restricted to a horizontal plane, but in fact can be any configuration of cells connected by a common control line. Likewise, a column of memory and the respective sense amplifiers can be positioned in various locations while providing advantageous dual stage sensing of memory cells.

Figure 9:
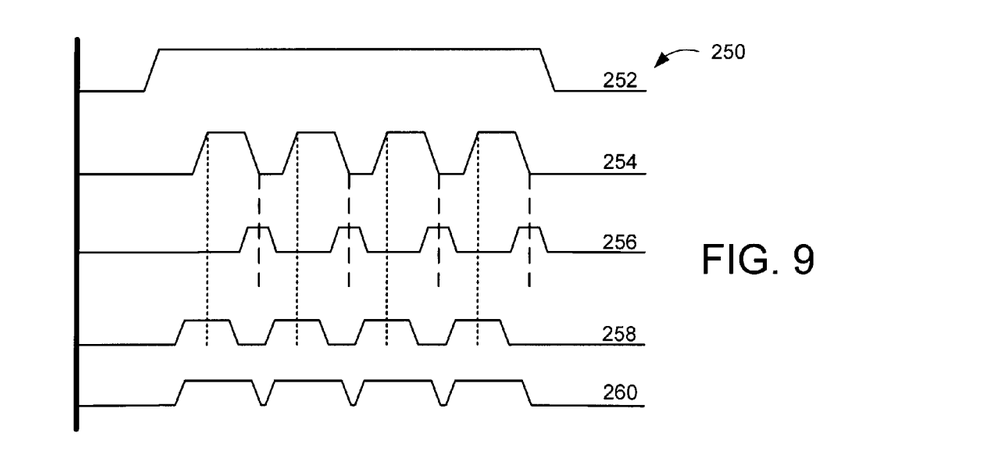
FIG. 9 illustrates a timing diagram of various components of a block of memory cells in accordance with various embodiments of the present invention.

FIG. 9 provides an exemplary timing diagram 250 of various component of a block of memory cells such as the blocks shown in FIGS. 5-8. Initially, selection of a predetermined memory cell or cells begins with a row control line being activated, shown by line 252. During activation of a row of memory cells, current is capable of passing through the selected cells to either read or write a logical state. While multiple columns of memory can simultaneously be read, as discussed above, with the concurrent sensing and differentiating of resistive states of multiple columns, a single column of memory can also be read singularly and successively, as displayed in line 254.

However, the outputting of an entire row of logical states could be similar to line 254 except for a single activation that would correspond to a concurrent sensing of voltage passing through all the memory cells of the row. Nevertheless, line 256 illustrates the resulting outputting of logical states by the column sense amplifiers of each respective column. Furthermore, as shown by line 258, logical states can also be written to or read from selected memory cells while a row and column are activated by their respective control lines. Line 260 further provides an extended data output mode in which data is selected memory cells are activated for a longer amount of time than the operation shown in line 258.

In addition, various protocols can be implemented with the configuration of memory cells and dual stage sensing that cannot be easily implemented with non-volatile memory. One such protocol is an extended data output that maintains current sensing through selected memory cells for an extended period of time. Another such protocol is the activation and outputting of logical states from a single column of memory followed by the outputting of programmed states from successive columns based on a clock cycle. As can be appreciated, a clock cycle can be produced by various components and is not limited to a certain point of origin or duration.

It can also readily be appreciated that the various combinations of simultaneous and successive dual stage sensing of columns of memory are possible with the arrays shown in FIGS. 5-8. Therefore, the timing and outputting of programmed logical states can be tailored to specific needs of a host while maintaining improved efficiency and reliability due to dual stage sensing of all resistive states. However, it should be noted that the timing of the various components is not limiting and can vary, as needed, to accommodate desired functions.

Figure 10:
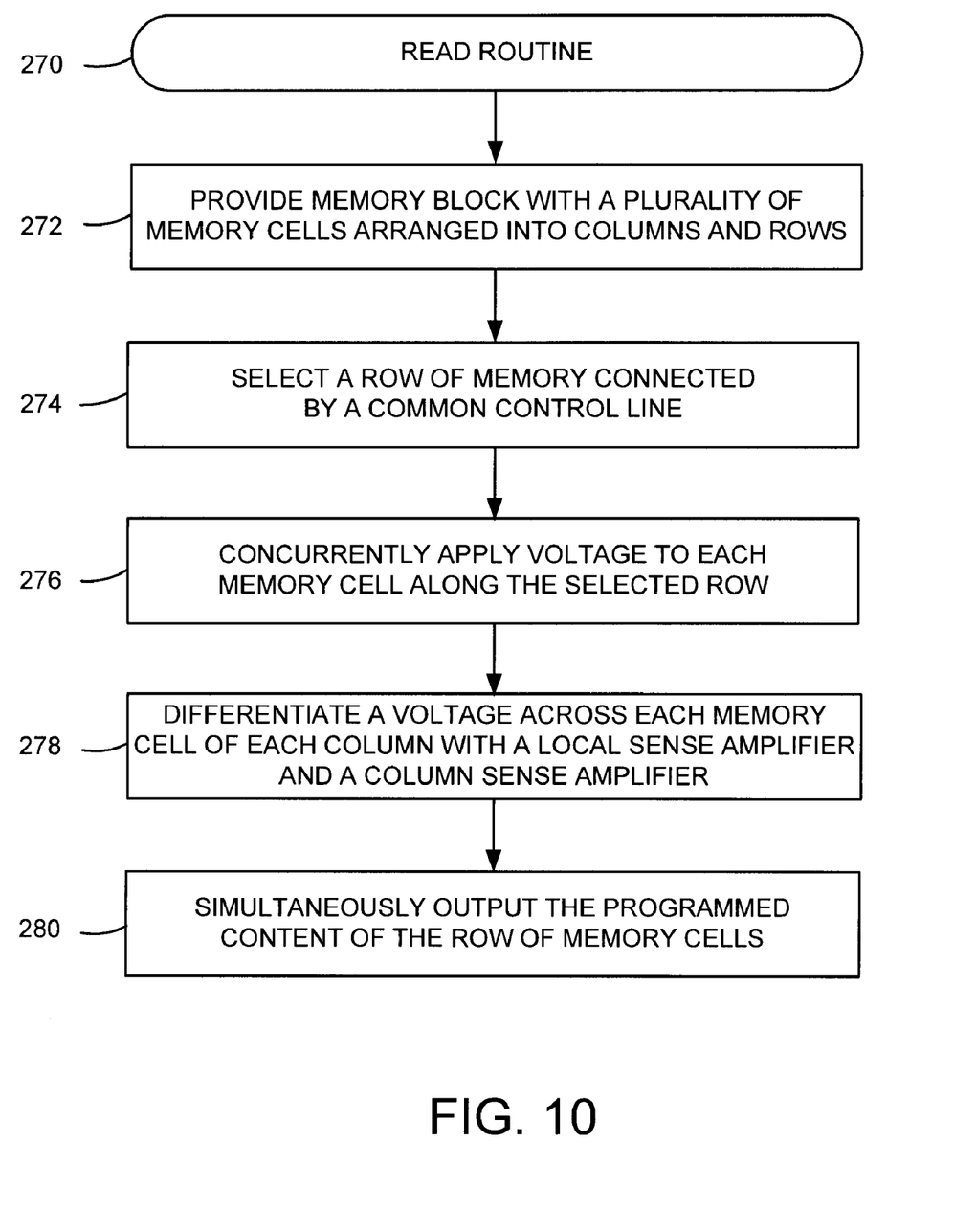
FIG. 10 displays a flowchart of a read routine performed in accordance with various embodiments of the present invention.

FIG. 10 provides a flowchart of a read routine 270 performed in accordance with various embodiments of the present invention. The read routine 270 initially provides a memory block having a plurality of memory cells arranged into columns and rows in step 272. Subsequently in step 274, a row of memory cells connected by a common control line is selected. In some embodiments, multiple rows of memory cells are activated by dissimilar control lines.

Furthermore, a read circuit is operated to concurrently apply voltage to each memory cell along the selected row in step 276. It should be noted that the read circuit can be configured to concurrently apply voltage to across multiple rows, as desired. As the voltage is modified by the existing resistive state of each memory cell, a local sense amplifier and column sense amplifier are used to dually differentiate the voltage into a corresponding programmed logical state for each column in step 278. Finally, the sensed programmed logical states of all the selected memory cells are outputted simultaneously in step 280.

As can be appreciated by one skilled in the art, the various embodiments illustrated herein provide advantageous reading of data from memory cell in an efficient manner. The use of dual sense amplifiers to differentiate programmed content from a memory cell allows for scaleable memory blocks that can be quickly and reliably read. With several sense amplifiers for each column of memory, the small sense margin common associated with non-volatile memory cells can be overcome to output large volumes of data efficiently. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. An apparatus comprising:
   a memory block comprising a plurality of non-volatile memory cells arranged into rows and columns, first and second memory cells physically positioned adjacent each other in dissimilar columns and rows; and
   a read circuit configured to read a selected row of the memory block by concurrently applying a control voltage to each non-volatile memory cell along the selected row and, for each column, using a local sense amplifier and a column sense amplifier to successively differentiate a voltage across an associated non-volatile memory cell.

2. The apparatus of claim 1, wherein the non-volatile memory cells are characterized as a resistive sense memory (RSM) comprising spin torque random access memory (STRAM) cells.

3. The apparatus of claim 1, wherein each non-volatile memory cell is connected in series with the local sense amplifier and the column sense amplifier.

4. The apparatus of claim 1, wherein a plurality of line drivers provide voltage for each column of non-volatile memory cells.

5. The apparatus of claim 1, wherein the local sense amplifier is connected to the column sense amplifier by a column control line that has increased conductive capacity in relation to a section control line.

6. The apparatus of claim 1, wherein a plurality of logical states corresponding to the number of memory cells in a row is outputted by a plurality of the column sense amplifiers simultaneously.

7. The apparatus of claim 1, wherein the row of memory cells comprises a common control line that is capable of activating a switching device in each memory cell simultaneously.

8. The apparatus of claim 1, wherein a section address of the associated non-volatile memory cell in the row differs from a physical address of the associated memory cell in an array.

9. The apparatus of claim 1, wherein the read circuit is configured to sequentially output a programmed content of the selected row.

10. The apparatus of claim 1, wherein the local sense amplifier is configured to increase the outputted voltage of the associated memory cell.

11. A method comprising providing a memory block comprising a plurality of non-volatile memory cells arranged into rows and columns, a first and second memory cells being physically adjacent in dissimilar rows and columns, and reading a selected row of the memory block by concurrently applying a control voltage to the first memory cell along the selected row and, without accessing the second memory cell, using a local sense amplifier and a column sense amplifier to successively differentiate a read voltage across an associated memory cell to output a programmed content of the selected row.

12. The method of claim 11, wherein the non-volatile memory cells are individually accessible resistive sense memory (RSM) cells.

13. The method of claim 11, wherein each non-volatile memory cell is connected in series with the local sense amplifier and the column sense amplifier.

14. The method of claim 11, wherein a plurality of line drivers provide voltage for each column of non-volatile memory cells.

15. The method of claim 11, wherein the local sense amplifier is connected to the column sense amplifiers by a column control line that has increased conductive capacity in relation to a section control line.

16. The method of claim 11, wherein a plurality of logical states corresponding to the number of non-volatile memory cells in a row is outputted by a plurality of the column sense amplifiers simultaneously.

17. The method of claim 11, wherein the row of non-volatile memory cells comprises a common control line that is capable of activating a switching device in each non-volatile memory cell simultaneously.

18. The method of claim 11, wherein concurrently applying a control voltage is done across more than one row.

19. The method of claim 11, wherein a clock signal is used to sequentially output the programmed content of a plurality of rows.

20. An apparatus comprising a memory block comprising a plurality of non-volatile memory cells arranged into rows and columns across a plurality of different vertical planes and a read circuit configured to read a selected row from each vertical plane of the memory block by concurrently applying a control voltage to each non-volatile memory cell along the selected row and, for each column, using a local sense amplifier and a column sense amplifier to successively differentiate a voltage across an associated non-volatile memory cell, wherein each column comprises at least a first section and a second section that each share common local sense amplifier.

* * * * *